(12) United States Patent
Yen et al.

(10) Patent No.: US 7,341,879 B2
(45) Date of Patent: Mar. 11, 2008

(54) METHOD OF MANUFACTURING A POINT SOURCE LIGHT-EMITTING DIODE

(75) Inventors: Tzu-Ying Yen, Tainan (TW); Han-Tsun Lai, Hsinchuang (TW); Jen-Chau Wu, Hsinchu (TW); Chung-Cheng Tu, Taipei (TW)

(73) Assignee: Epistar Corporation, Hsinchu (TW)

( * ) Notice: Subject to any disclaimer, the term of this patent is extended or adjusted under 35 U.S.C. 154(b) by 52 days.

(21) Appl. No.: 11/481,833

(22) Filed: Jul. 7, 2006

(65) Prior Publication Data

US 2006/0249740 A1 Nov. 9, 2006

Related U.S. Application Data

(62) Division of application No. 11/008,390, filed on Dec. 10, 2004, now Pat. No. 7,109,525.

(30) Foreign Application Priority Data

Oct. 8, 2004 (TW) .............................. 93130575 A (51) Int. Cl.
*H01L 21/00* (2006.01)
(52) U.S. Cl. ............... 438/24; 438/22; 438/48; 257/91; 257/E33.027; 257/E33.067

(58) Field of Classification Search ............ 438/22–24, 438/48–52
See application file for complete search history.

(56) References Cited

U.S. PATENT DOCUMENTS 6,445,007 B1 * 9/2002 Wu et al. ..................... 257/80

\* cited by examiner

*Primary Examiner*—Dung A. Le
(74) *Attorney, Agent, or Firm*—Rosenberg, Klein & Lee (57) ABSTRACT

A point source light emitting-diode (LED) comprises a substrate, an epitaxy structure, a first electrode, an isolation layer, a bonding layer, a contact layer, and a connection bridge. The epitaxy structure is located on the substrate, and the substrate has a pattern including a light emitting area located on the light-emitting surface of the epitaxy structure. The first electrode is located on the substrate, and the isolation layer is located on the epitaxy structure adjacent to the first electrode. The contact layer is located on the first electrode, and the bonding layer is located on one portion of the isolation layer. The connection bridge with a width less than one half of the diameter of the light emitting area is located on the other portion of the isolation layer, thereby connecting the contact layer and the bonding layer.

13 Claims, 7 Drawing Sheets

METHOD OF MANUFACTURING A POINT SOURCE LIGHT-EMITTING DIODE

This application is a Divisional patent application of application Ser. No. 11/008,390, filed on 10 Dec. 2004, now U.S. Pat. No. 7,109,525.

RELATED APPLICATIONS

The present application is based on, and claims priority from, Taiwan Application Serial Number 93130575, filed on Oct. 8, 2004, the disclosure of which is hereby incorporated by reference herein in its entirety.

FIELD OF THE INVENTION

The present invention relates to a light-emitting diode (LED), and more particularly, to the point source LED having an improved surface feature and the manufacturing method for making the same.

BACKGROUND OF THE INVENTION

A LED is a p-n junction diode that can emit light of various wavelengths, and has the characteristics of low power consumption, low heat generation, long operational life, small volume, good impact resistance, fast response, and excellent stability, so that the LED has been popularly used in electric appliance field as a light source.

In optoelectric applications, a LED also has been used as an important active component of optical fiber communications, due to its reliability and high beam-coupling ratio with the optical fiber. Generally, to obtain high light-coupling efficiency with optical fibers, a point source LED is selected as the light source of communications, because of its lower view angel. However, a conventional LED having a bonding area located on the center of the light emitting area not only restricts the light emitting that can affect the emitting shape, but also reduces the light emitting efficiency.

To resolve this problem, a lens is provided to concentrate the light emitted from the point source LED into a light beam. However, the addition of lens requiring additional assembly processes and materials is not competitive in the market.

U.S. Pat. No. 6,063,643 provides a method of concentrating the local current into a LED to produce the concentrated emitting light. In the disclosed art, a light-emitting diode is etched to form an emitting area. Then the epitaxy structure and the electrode surrounding the light emitting area are selectively oxidized. By the treatment, the conventional problems of light emitting restriction can be avoided, so that, the emitted light can be focused into a light beam without any additional lenses. However, only the materials suitable for oxidizing, such as AlGaAs or AlAs can be used as the epitaxy structure. And the treatment of selective oxidization conducted on the epitaxy structure can increase the complexity and cost of the LED manufacturing processes.

Japanese Unexamined Patent Publication (Kokai) No. Heisei 2-174272 discloses another LED of high brightness. In the disclosed art, by etching the epitaxy structure of the LED, a light emitting area is provided. Consequently, a circle electrode is provided by a series of doping and etching processes. Through the treatment, the lightness of the LED can be increased and the light can be concentrated into a single beam. However the doping process requires high operation temperatures that could cause the degradation of the LED.

It is desirable; therefore, to provide a point source LED with high lightness, concentrative emitting light, and with simple manufacturing processes.

SUMMARY OF THE INVENTION

Therefore, one objective of the present invention is to provide a point source LED with high lightness, concentrative emitting light, simple manufacturing processes and the method for making the point LED to resolve the problems of low light-coupling efficiency of the conventional LED used in optical fiber communication devices.

In an embodiment of the present invention, a point source LED is provided. The point source LED comprises a substrate, an epitaxy structure, a first electrode, an isolation layer, a bonding layer, a contact layer, and a connection bridge, wherein the epitaxy structure is located on the substrate having a pattern that includes a light emitting area located on the light emitting surface of the epitaxy structure; the first electrode is located on the substrate; the isolation layer is located on the epitaxy structure in adjacent to the first electrode; the contact layer is formed on the first electrode; the bonding layer is located on one portion of the isolation layer having a width that is less than one half of the diameter of the light emitting area located on the other portion of the isolation layer, and making a connection between the contact layer and the bonding layer.

According to another preferred embodiments of the present invention, the manufacturing method of the point source LED aforementioned is provided. First, a substrate is provided. An epitaxy structure is formed on the substrate. Forming a first electrode on one portion of the epitaxy structure before an isolation layer is formed on the other portion of the epitaxy structure adjacent to the first electrode. Then, a metal layer is formed in adjacency to the first electrode and the isolation layer. After the metal layer is formed, a patterning process is performed on the metal layer to define the metal layer into three parts including a connecting bridge, and a contact layer. A mesa etch is then conducted onto the epitaxy structure, so that at least one portion of the epitaxy structure below the contact area remains so as to form a light emitting area. Then, a second electrode is formed. Consequently, a series of downstream processes are performed to complete the point source LED.

The point source LED is used to concentrate the local current flowing through the contact layer to enhance the emitted light focusing into a light beam.

Accordingly, the LED with increased brightness and beam-coupling ratio can be accomplished by the present invention, and the present invention can resolve the light emitting problems due to the bonding processes without adding any complex processes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawing, wherein.

DETAILED DESCRIPTION OF THE PREFERRED EMBODIMENT

The present invention discloses a point source LED for optical fiber communications and the manufacturing method for making the point source LED. The point source LED with increased brightness and beam-coupling ratio is accomplished without adding any complex processes. Therefore, the emitted light can be focused into to a predetermined shape.

According the present invention, the LED comprises a substrate, an epitaxy structure, a first electrode, and a second electrode, an isolation layer, a contact layer a connection bridge, and a bonding layer are provided.

Figure 1A:
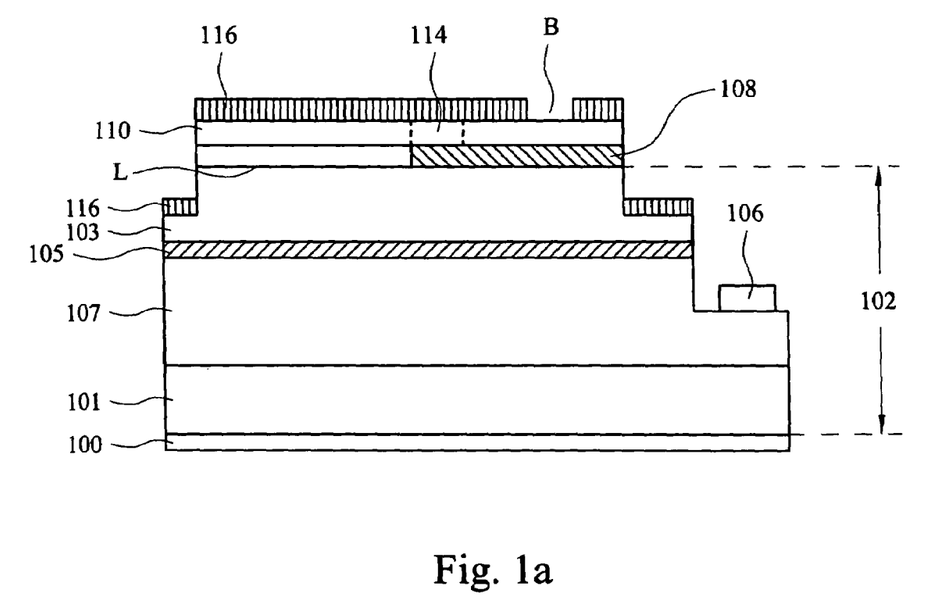
FIG. 1a is a cross sectional diagram showing a point source LED in accordance with the first embodiment of the present invention.

Referring to FIG. 1a, FIG. 1a is a cross sectional diagram showing a point source LED in accordance with the first embodiment of the present invention. In the fist embodiment of the present invention, the epitaxy structure 102 is grown on the substrate 100, wherein the substrate 100 is preferably made of n-type GaAs. The epitaxy structure 102 is made of III-V semiconductor materials, such as GaP, $Ga_{1-x}Al_xAs$, $GaAs_{1-y}P_y$, $ZnS_{1-z}Se_z$, AlGaInP, AlInGaN, wherein MgZnSSe, AlGaInP, AlInGaN, MgZnSSe, and $Ga_{1-x}Al_xAs$ preferably. The epitaxy structure 102 includes a plurality of layers, such as a buffer layer 101, an n-type cladding layer 103, an active layer 105, and a P-type cladding layer 107 stacked sequentially. In the embodiment, the material of buffer layer 101 may be preferably such as n-type GaAs. The n-type cladding layer 103 may be made of a wide bandgap n-type AlGaInP, preferably. The active layer 105 may be preferably made of narrow bandgap AlGaInP, or AlGaInP with multi-quantum well. The material of p-type cladding layer 107 may be preferably such as wide bandgap p-type AlGaInP.

Figure 1B:
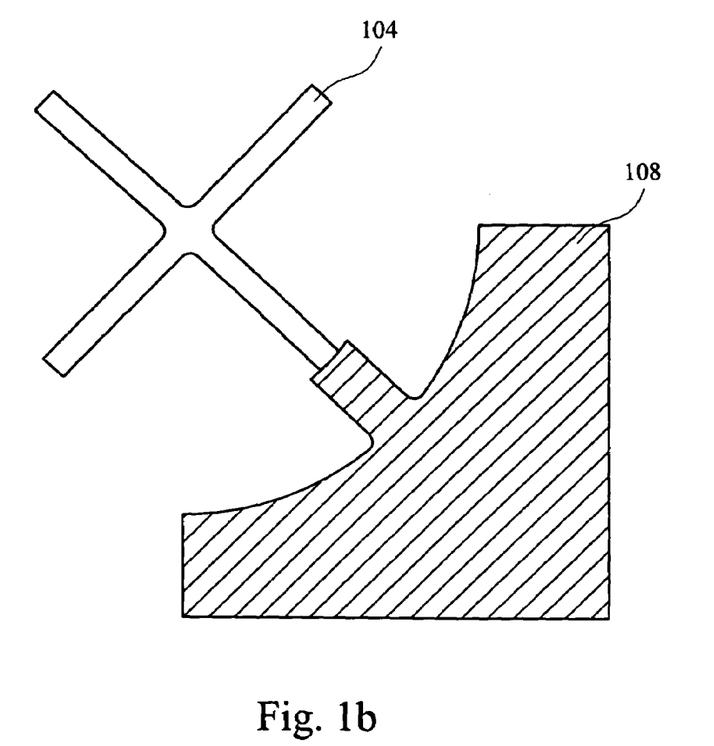
FIG. 1b is a top view diagram showing a point source LED in accordance with the first embodiment of the present invention.

Referring to FIG. 1b, FIG. 1b is a top view diagram showing a point source LED in accordance with the first embodiment of the present invention. In the first embodiment of the present invention, the epitaxy structure 102 has a pattern that at least includes a light emitting area L. The light emitting area L can be in various shapes including a circle, a ring, a polygon, or a cross. In the first embodiment of the present invention, the light emitting area L may be a circle with a diameter less than 150 μm. According to the present invention, the pattern of the epitaxy structure 102 is located in the cladding layer for emitting light. In some embodiments of the present invention, the pattern is located in the n-type cladding layer 103. In the other embodiments of the present invention, the pattern is located in the p-type cladding 107. In the first embodiment of the present invention, the pattern of the epitaxy structure 102 is located in the n-type cladding layer 103.

Figure 1C:
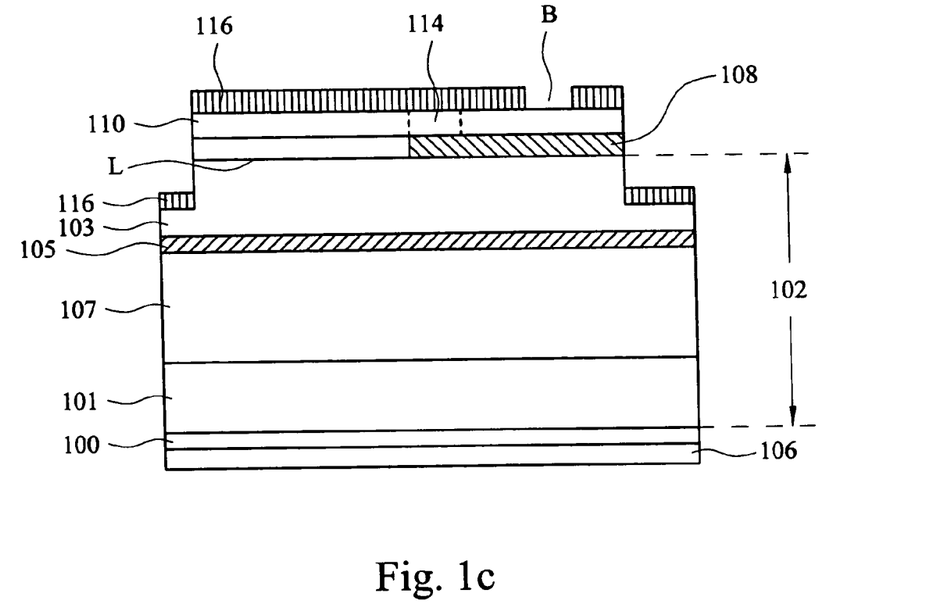
FIG. 1c is a cross sectional diagram showing a point source LED in accordance with the first embodiment of the present invention.

Referring to FIG. 1c, a first electrode 104 and a second electrode 106 are formed on the epitaxy structure 102, and the first electrode 104 cannot directly contact the second electrode 106. In some embodiments of the present invention, the first electrode 104 and the second electrode 106 are located on the same side of the substrate 100 (referring to FIG. 1a). In the other embodiments of the present invention, the first electrode 104 and the second electrode 106 are located on the opposite sides of the substrate 100 respectively (Referring to FIG. 1c). In the first embodiment of the present invention, the first electrode 104 and the second electrode 106 are located on the opposite sides of the substrate 100 respectively. According to the present invention, the fist electrode 104 is a patterned layer. The patterned layer can be in various shapes comprising a circle, a ring, a polygon, or a cross. In the first embodiment of the present invention, the first electrode 104 may be a cross. The materials used to form the first electrode 104 or the second electrode 106 may be the material of excellent conductivity with the epitaxy structure 102, such as an ohmic metal or a transparent conductive material, wherein the transparent conductive material can be such as ITO (Indium-Tin-Txide), ZnO, SnCdO, WTiN, InO, SnO or MgO. The ohmic metal can be such as Au, Ag, Al, Ni, Ti, Ge/Au alloy, or other metal. In the first embodiment of the present invention, the first electrode 104 and the second electrode 106 are made of Ge/Au alloy.

Referring to FIG. 1b, an isolation layer 108 is formed on the epitaxy structure 102 adjacent to the first electrode 104. The isolation layer 108 is made of isolation materials, such as SiON, SiNx, $SiO_2$, $AlO_2$ or polyimide, and the preferable material is SiNx.

Figure 1D:
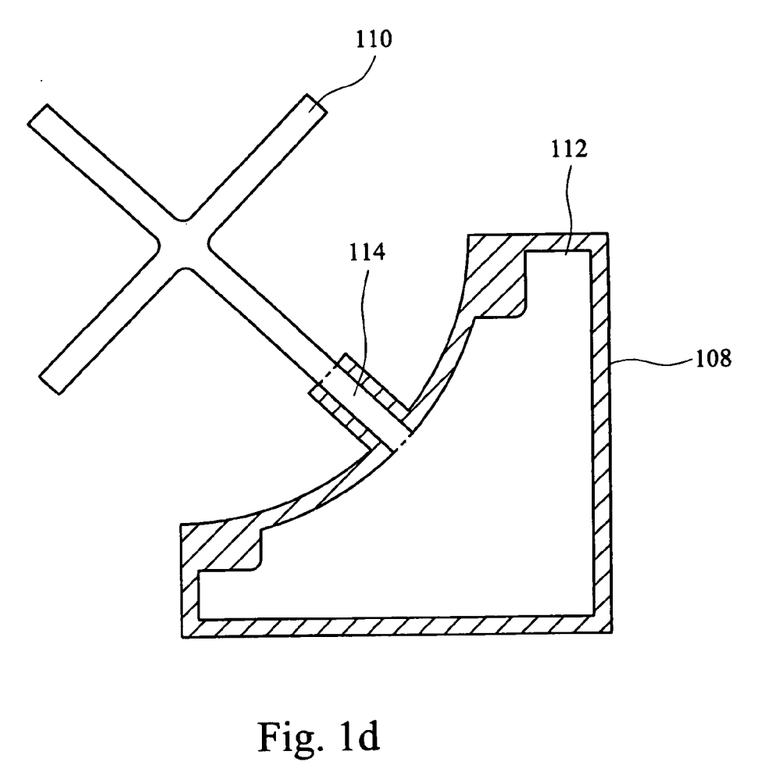
FIG. 1d is a top view diagram showing a contact layer, a bonding layer, and a connection bridge in accordance with the first embodiment of the present invention.

Referring to FIG. 1d, FIG. 1d is a top view diagram showing a structure including a contact layer 110, a bonding layer 112, and a connection bridge 114 in accordance with the first embodiment of the present invention. The contact layer 110 is adjacent to the first electrode 104, and an electric contact is formed between the contact layer 110 and the first electrode 104. According to the present invention, the contact layer 110 is also a patterned conductive layer. The contact layer 110 can be in various shapes, such as a circle, a ring, a polygon, or a cross. In the first embodiment of the present invention, the contact layer 110 may be a cross in alignment with the first electrode 104. The bonding layer 112 as a target area for positioning purpose in the consequent bonding process is formed in adjacency to the isolation layer 108 and the connection bridge 114. The connection bridge 114 formed on the isolation layer 108 is a narrow electrically conductive passage as a connection between the bonding layer 112 and the contact layer 110, and makes a electric contact between the bonding layer 112 and the contact layer 110. The preferable width of the connection bridge 114 is less than one half of the diameter of the light emitting area L. In the present invention, each of the contact layer 110, the bonding layer 112 and the connection bridge 114 cannot connect with the second electrode directly. The isolation layer 108 is used for dividing the epitaxy structure 102 from each of the contact layer 110, the bonding layer 112 and the connection bridge 114 to prevent the forming of electric contacts between the epitaxy structure 102 and each of the contact layer 110, the bonding layer 112, and the connection bridge 114 directly. In some embodiments, the contact layer 110, the bonding layer 112, and the connection bridge 114 may be formed simultaneously with the same materials by the same processes. In the other embodiments, the contact layer 110, the bonding layer 112, and the connection bridge 114 may be formed respectively with different materials by different processes. The preferable materials, such as Au, Ag, Al, Ni, Ti, Cr, Au alloy, or other metal, are used for forming each of the contact layer 110, the bonding layer 112, and the connection bridge 114. In the first embodiment of the present invention, the contact layer 110, the bonding layer 112, and the connection bridge 114 are formed within the same conductive layer that is made of Au alloy by the same process. The connection bridge 114 has a width, and the width is less than 30 μm.

In the first embodiment of the present invention, the point source LED further comprises a passive layer 116 formed on each of the contact layer 110, the bonding layer 112, the connection bridge 114, the isolation layer 108, and the epitaxy structure 102. The preferable material for forming the passive layer 116 is such as SiNx, SiNxOy or $SiO_2$.

Figure 1E:
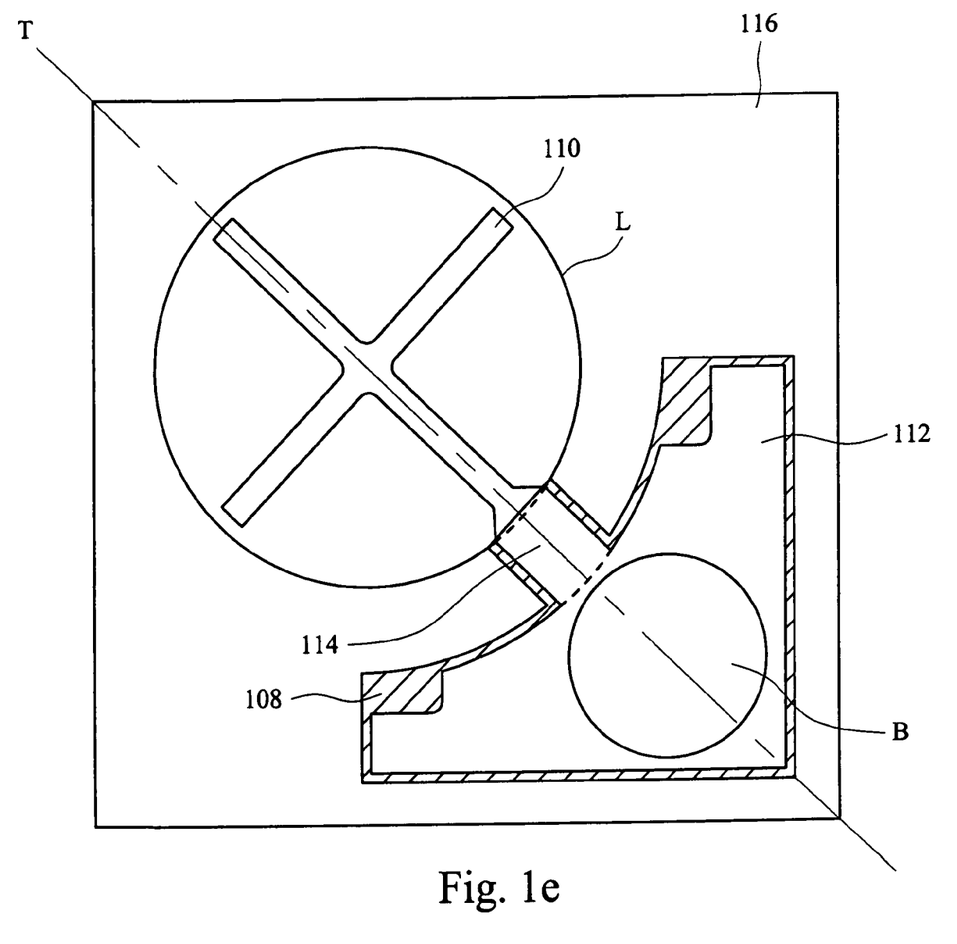
FIG. 1e is a top view diagram showing a point source LED in accordance with the first embodiment of the present invention.

Referring to FIG. 1e, FIG. 1e is a top view diagram of a point source LED in accordance with the first embodiment of the present invention. The outer layer of the point source LED is the passive layer 116 having a pattern that can expose one portion of the bonding layer 112. The bonding process can be conducted onto the exposed portion of the bonding layer 112, named as bonding area B. An electric contact can be formed between an outer conductive wire (not shown) and the bonding area B. Such that, current flowing from the outer conductive wire can be conducted into the epitaxy structure 102 through the bonding area B, the connection bridge 114, the contact layer 110, and the first electrode 104 sequentially. The current can be concentrated in the light emitting area L below the first electrode 104 before flowing into the active layer 105, due to the patterns formed on the first electrode 104, the contact layer 106, and the connection bridge 114. Light emitted from the active layer 105 can go through the light emitting area L, the first electrode 104, and the contact layer 110 to form a beam outward the point source LED.

Because of the local current is concentrated in the light emitting area L. Therefore, the brightness and the beam-coupling ratio of the point source LED are enhanced, and by effectively concentrating the local current, a predetermined light beam can be provided, and the optical fiber can be coupled directly without any additional optical split device.

Referring to FIG. 2a to FIG. 2h, FIG. 2a to FIG. 2h are a series of cross section diagrams showing the process steps of the point source LED in accordance with the second embodiment of the present invention.

Figure 2A:
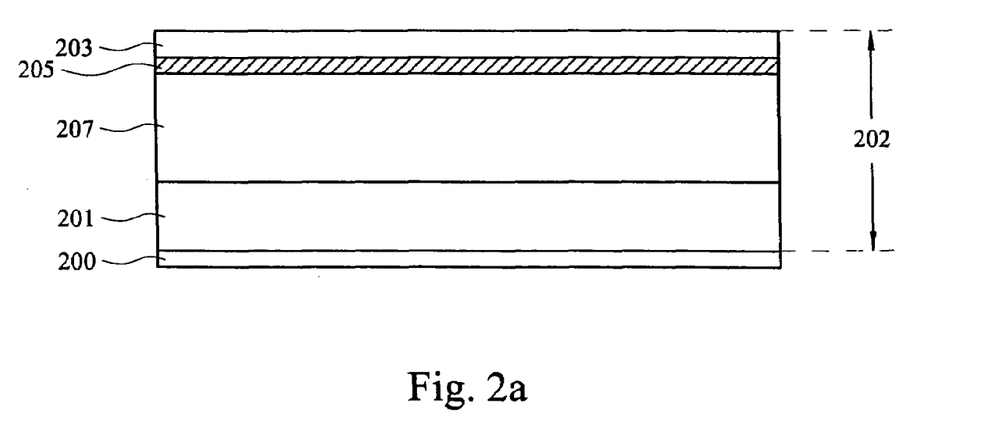
FIG. 2a to FIG. 2h are a series of cross sectional diagrams showing the process steps of the point source LED in accordance with the second embodiment of the present invention.

Referring to FIG. 2a, an epitaxy structure 202 comprising a buffer layer 201, an n-type cladding layer 203, an active layer 205, and a P-type cladding layer 207 is formed on a substrate 200 by a metal organic chemical vapor deposition (MOCVD) process. The epitaxy structure 202 is made of III-V semiconductor materials, such as GaP, $Ga_{1-x}Al_xAs$, $GaAs_{1-y}P_y$, $ZnS_{1-z}Se_z$, AlGaInP, AlInGaN, wherein MgZnSSe, AlGaInP, AlInGaN, MgZnSSe, and $Ga_{1-x}Al_xAs$ are preferable. In the embodiment, the preferred material of buffer layer 201 may be such as n-type GaAs. The n-type cladding layer 203 may be preferably made of a wide bandgap n-type AlGaInP. The active layer 205 may be preferably made of narrow bandgap AlGaInP, or AlGaInP with multi-quantum well. The preferable material of p-type cladding layer 207 may be wide bandgap p-type AlGaInP.

Figure 2B:
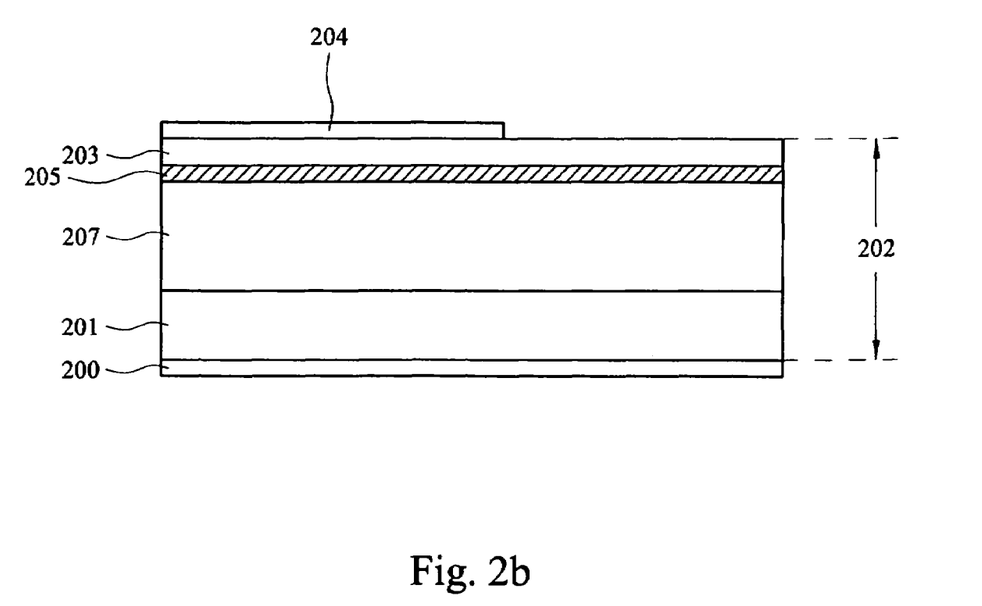

Next, referring to FIG. 2b, FIG. 2b is the cross sectional view showing the structure after a first electrode 204 is formed on the epitaxy structure 202. The materials of excellent conductivity with the epitaxy structure 202 can be deposited on the epitaxy structure 202 by a deposition process, for example, electron enhanced evaporation, thermal evaporation, or sputtering deposition, to form the first electrode 204. The materials used to form the first electrode 204 comprise an ohmic metal layer or a transparent conductive material, wherein the transparent conductive material can be such as ITO, ZnO, SnCdO, WTiN, InO, SnO, MgO. The ohmic metal layer can be such as Au, Ag, Al, Ni, Ti, Cr, Au alloy, or other metal. In the second embodiment of the present invention, the first electrode 204 is made of Au alloy.

Referring to FIG. 2b, FIG. 2b is the cross sectional view showing the structure after the first electrode 204 of the FIG. 2 is patterned. After the first electrode 204 is formed, a first photoresist (not shown) is deposited on the first electrode 204, and then the first electrode 204 is etched, so that one portion of the epitaxy structure 202 can be exposed. As a result, a structure of the FIG. 2b is formed after the first photoresist is removed.

Figure 2C:
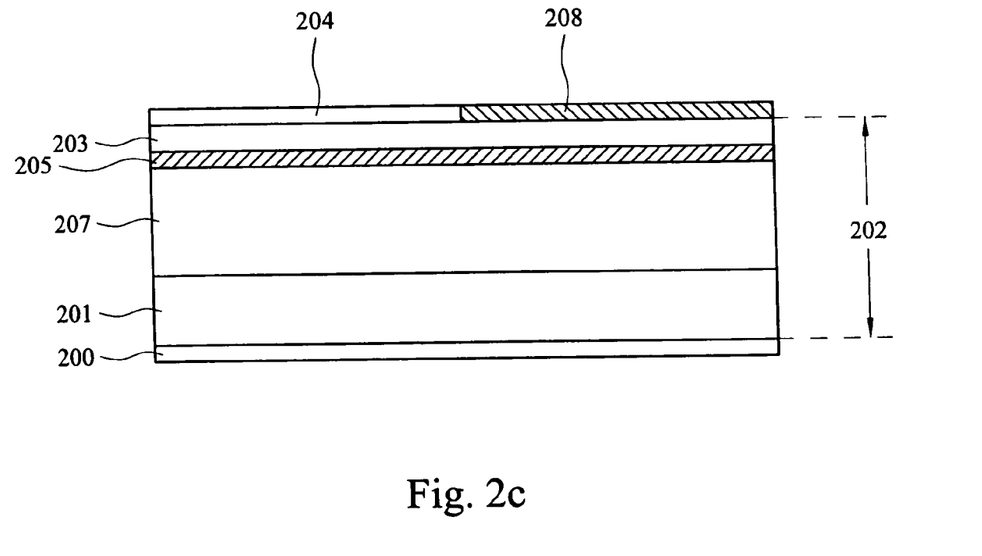

Referring to FIG. 2c, FIG. 2c is the cross sectional view showing the structure after an isolation layer 208 is formed on the structure of the FIG. 2b. An isolation material, such as SiON, SiNx, $SiO_2$, $AlO_2$ or polyimide is deposited on the first electrode 204 and the exposed portion of the epitaxy structure 202. Then, portions of the isolation material above the top surface of the first electrode 204 are removed to form the isolation layer 208.

Figure 2D:
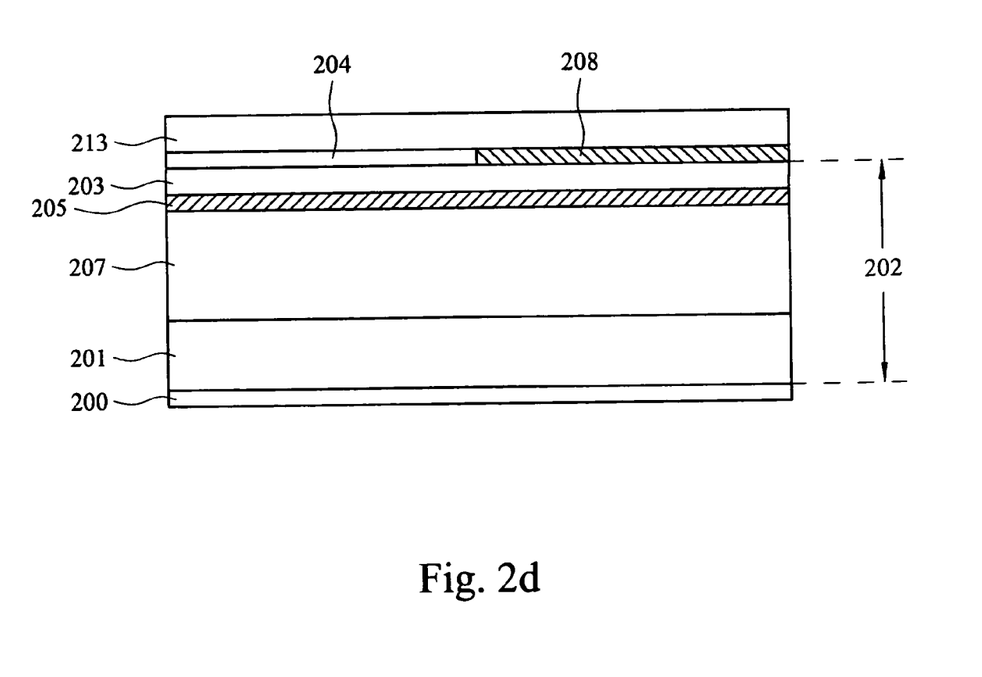

Referring to FIG. 2d, FIG. 2d is the cross sectional view showing the structure after a metal layer 213 is formed on the structure of the FIG. 2c. A deposition process, such as electron enhanced evaporation, thermal evaporation, or sputtering deposition, is conducted to form the metal layer 213 on the first electrode 204 and the isolation layer 208. The materials used to make of the metal layer 213 can be such as Au, Ag, Al, Ni, Ti, Cr, Au alloy, or other metal. In the second embodiment of the present invention, the metal layer 213 is made of Au alloy.

Figure 2E:
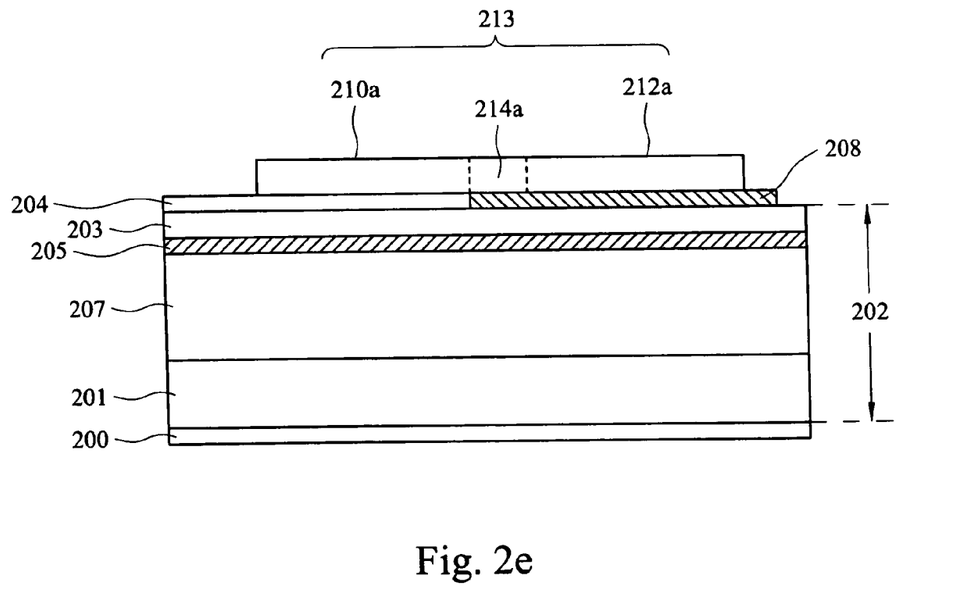

After the metal layer 213 is formed, a pattern process is conducted. Referring to FIG. 2e, FIG. 2e is the cross sectional view showing the structure after the pattern process is conducted on the metal layer 213. A second photoresist (not shown) is formed on the metal layer 213. Before the second photoresist is removed, an etching process is performed on the metal layer 213 to expose portions of the isolation layer 208 and portions of the epitaxy structure 202. The remaining metal layer 213 comprises three parts including a bonding layer 212a, a contact layer 210a, and a connection bridge 214a. The contact layer 210a and the connection bridge 214a are located on and adjacent to the isolation layer 208 but do not contact the epitaxy structure 202 directly. The contact layer 210a is located on the first electrode 204, and forms an electric contact between the contact layer 210a and the first electrode 204. In the second embodiment of the present invention, the contact layer 210a is in alignment with the first electrode 204, and the contact layer 210a and the bonding layer 212a are electrically connected by the connection bridge 214a and 214b. The connection bridge 214a is a narrow electrically conductive passage having a width, and the width is less than one half of the diameter of the contact layer 210a. The contact layer 210a can be in various shapes, such as a circle, a ring, a polygon, or a cross. The bonding layer 212a is a target area for the subsequently bonding process to connect outer wires (not shown).

Figure 2F:
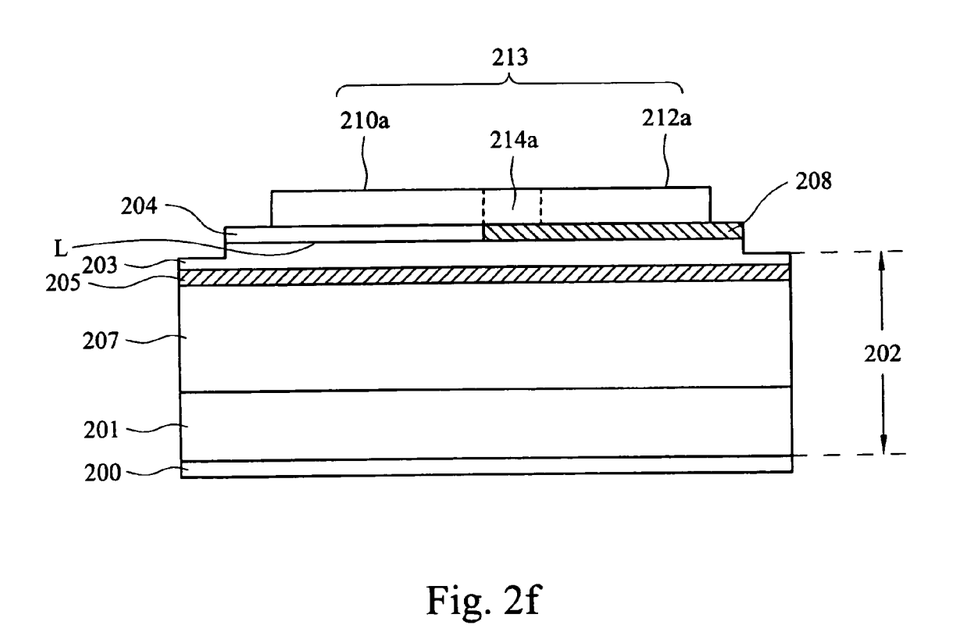

Next, a mesa etching process is conducted to the epitaxy structure 202 adjacent to the first electrode 204 and the isolation layer 208. Referring to FIG. 2f, FIG. 2f is the cross sectional structure after the epitaxy structure 202 of FIG. 2e is mesa etched. A mask (not shown) is formed to cover the patterned metal layer 213 and one portion of the isolation layer 208. Before the mask is removed, an etching process, such as wet etching or reactive ion etching, is performed at least to form a light emitting area L in the epitaxy structure 202 beneath the fist electrode 204. The light emitting area L can be in various shapes, such as a circle, a ring, a polygon, or a cross. In the second embodiment of the present invention, the light emitting area L is a circle with a diameter less than 150 µm.

Figure 2G:
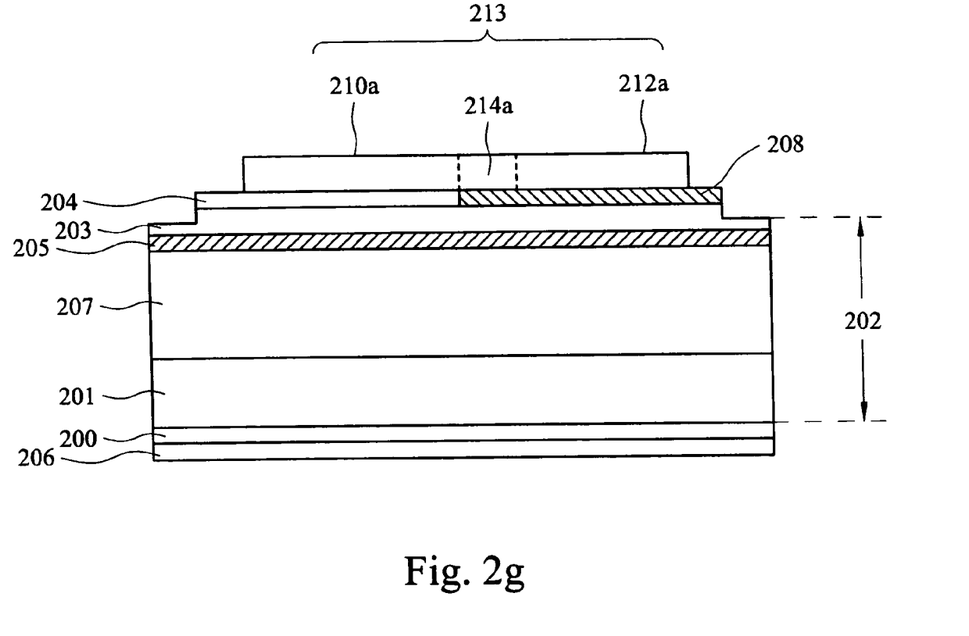

Consequently, a second electrode 206 is formed on one side of the substrate 200. Referring to FIG. 2g, FIG. 2g is the cross sectional structure after a second electrode 206 is formed on the structure of FIG. 2f. In the embodiment of the present invention, the second electrode 206 is deposited on the substrate 200. In the other embodiments of the present invention, the second electrode 206 also can be formed on the part of the surface of the epitaxy structure 202 that is not etched by the mesa etching process (referring to FIG. 1a). Before the second electrode 206 is deposited on the substrate 200, a protection layer (not shown) is formed on the exposed part of the n-type cladding layer 203, the metal layer 213, portion of isolation layer 208, and the sidewalls of these layers, so as to prevent the second electrode 206 from making direct electric contact with the metal layer 213, the first electrode 204, and the mesa etched surface of the epitaxy structure 202. The preferable materials of the protection layer can be $SiO_2$ or SiO.

According to the invention, the first electrode 204 and the second electrode 206 are formed on the epitaxy store 202, and the first electrode 204 cannot contact the second electrode 206 directly. In some embodiments of the present invention, the first electrode 204 and the second electrode 206 are located on the same side of the substrate 200 (such as shown in FIG. 1a). In the other embodiments of the present invention, the first electrode 204 and the second electrode 206 are located on the opposite sides of the substrate 200 respectively (such as shown in FIG. 1c). In the second embodiment of the present invention, the first electrode 204 and the second electrode 206 are located on the opposite sides of the substrate 200 respectively.

The materials used to form the second electrode 206 can be the materials, such as ohmic metal or transparent electrode, wherein the transparent electrode can be such as ITO (indium-tin-oxide), ZnO, SnCdO, WtiO, InO, SnO or MgO. The ohmic metal can be such as Au, Ag, Al, Ni, Ti, Au alloy, or other metal. In the first embodiment of the present invention, the second electrode 206 is made of Au alloy.

Figure 2H:
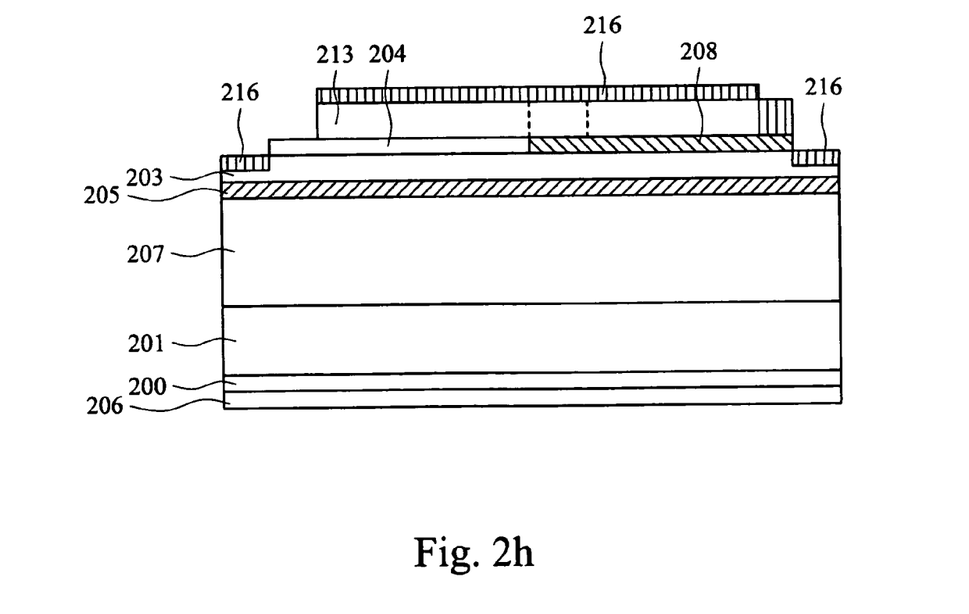

Then, the protection layer is removed. Referring to FIG. 2h, FIG. 2h is the cross sectional view showing the structure after a patterned passive layer 216 is formed on the structure of FIG. A passive layer 216 is deposited on the exposed part of the n-type cladding layer 203, the metal layer 213, the first electrode 204, and the isolation layer 208. Then, a pattern process is performed on the passive layer 216 to produce a pattern that can expose one portion of the bonding layer 212a. The exposed part of the bonding layer 212a named bonding area B can provide a location for a bonding processes. The preferred material for forming the passive layer 216 can be such as polyimide, polymer, SiNx, SiNxOy or $SiO_2$.

Local current, flowing from the outer wires through the bonding area B, the connection bridge 214a, the contact layer 210a, and the first electrode 204, can be conducted into the epitaxy structure 202. Because of the use of the designed patterns formed on the first electrode 204, and the contact layer 206, the local current form the outer conductive wire can be concentrated in the light emitting area L below the first electrode 204 before the local current flowing into the active layer 205. Light emitted from the active layer 205 can go through the light emitting area L, the first electrode 204, and the contact layer 210a to form a beam outward the point source LED.

According to the aforementioned description, one advantage of the present invention is that the use of designed patterns of the first electrode 204, the contact layer 206, and the mesa etched epitaxy structure 202 to produce a light beam with high brightness, and high beam-coupling ratio. The designed patterns can concentrate the emitted light and can eliminate the affect of the bonding wire to provide the emitted light beam a predetermined shape.

According to the aforementioned description, with the application of the point source LED of the present invention, the problems of low couple ratio of LED can be resolved without adding any complex steps.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for manufacturing a point source LED, comprising:
   providing a substrate;
   forming an epitaxy structure located on the substrate;
   forming a first electrode on one portion of the epitaxy structure;
   forming an isolation layer on the other portion of the epitaxy structure;
   forming a metal layer on the first electrode and the isolation layer;
   patterning the metal layer to form a contact layer on the first electrode, and to form a bonding layer and a connection bridge on the isolation layer;
   conducting a mesa etching process removing portions of the epitaxy structure to define a light emitting area below the contact layer; and
   forming a second electrode, either on the epitaxy structure or on the substrate.

2. The method for manufacturing a point source LED according to claim 1, further comprising a step for forming a passive layer on portions of the first electrode, the isolation layer, the metal layer, and the epitaxy structure.

3. The method for manufacturing a point source LED according to claim 1, further comprising a step for patterning the passive layer to expose one portion of the metal layer for positioning purpose in a bonding process.

4. The method for manufacturing a point source LED according to claim 1, wherein the steps for forming an epitaxy structure comprising the growth of III-V semiconductor materials, including a sequential stacked structure consisting of a buffer layer, an n-type cladding layer, an active layer, and a P-type cladding layer.

5. The method for manufacturing a point source LED according to claim 1, wherein the contact layer is a conductive material selected from a group consisting of an ohmic metals and a transparent conductive material.

6. The method for manufacturing a point source LED according to claim 1, wherein the step for forming the isolation layer comprises:
   patterning the first electrode to expose one portion of the epitaxy structure;
   depositing a isolation material on the exposed portions of the epitaxy structure and the first electrode; and removing the isolation material above the surface of the first electrode.

7. The method for manufacturing a point source LED according to claim 1, wherein the connection bridge is adjacent to the isolation layer and is connected with the contact layer.

8. The method for manufacturing a point source LED according to claim 7, wherein the connection bridge has a width less than 30 μm.

9. The method for manufacturing a point source LED according to claim 7, wherein the contact layer has a pattern selected from a group consisting of a circle, a ring, a polygon, and a cross.

10. The method for manufacturing a point source LED according to claim 9, wherein the pattern has a diameter less than 150 μm.

11. The method for manufacturing a point source LED according to claim 1, wherein the step for forming the second electrode comprises:

depositing a protection layer on portions of the contact layer, the bonding layer, the connection bridge, the isolation layer, and the first electrode;

forming a conductive layer either on the exposed surface of the epitaxy structure or on the substrate, and the conductive layer does not contact the first electrode directly; and removing the protection layer.

12. The method for manufacturing a point source LED according to claim 11, wherein the conductive layer and the first electrode are located on the same side of the substrate.

13. The method for manufacturing a point source LED according to claim 11, wherein the conductive layer and the first electrode are located on opposite sides of the substrate respectively.

* * * * *